(12) United States Patent
Wang et al.

(10) Patent No.: US 9,786,368 B2
(45) Date of Patent: Oct. 10, 2017

(54) TWO STAGE FORMING OF RESISTIVE RANDOM ACCESS MEMORY CELLS

(71) Applicants: Intermolecular Inc., San Jose, CA (US); Kabushiki Kaisha Toshiba, Tokyo (JP); SanDisk 3D LLC, Milpitas, CA (US)

(72) Inventors: Yun Wang, San Jose, CA (US); Federico Nardi, Palo Alto, CA (US)

(73) Assignees: Intermolecular, Inc., San Jose, CA (US); Kabushiki Kaisha Toshiba, Tokyo (JP); SanDisk 3D LLC, Milpitas, CA (US)

( * ) Notice: Subject to any disclaimer, the term of this patent is extended or adjusted under 35 U.S.C. 154(b) by 281 days.

(21) Appl. No.: 14/552,034

(22) Filed: Nov. 24, 2014

(65) Prior Publication Data

US 2016/0149130 A1    May 26, 2016

(51) Int. Cl.
| H01L 47/00 | (2006.01) |
| H01L 29/02 | (2006.01) |
| H01L 27/24 | (2006.01) |
| G11C 13/00 | (2006.01) |
| H01L 45/00 | (2006.01) |

(52) U.S. Cl.
CPC ...... *G11C 13/0069* (2013.01); *G11C 13/0007* (2013.01); *H01L 45/08* (2013.01); *H01L 45/1233* (2013.01); *H01L 45/145* (2013.01); G11C 2013/009 (2013.01); G11C 2013/0083 (2013.01); G11C 2213/32 (2013.01); G11C 2213/33 (2013.01); G11C 2213/34 (2013.01); G11C 2213/56 (2013.01); G11C 2213/71 (2013.01); G11C 2213/77 (2013.01); H01L 27/2409 (2013.01); H01L 27/2481 (2013.01)

(58) Field of Classification Search
CPC .............. G11C 13/0007; G11C 13/003; G11C 2213/56; G11C 2213/76; H01L 27/2409; H01L 27/2463; H01L 45/12; H01L 45/1233; H01L 45/146
See application file for complete search history.

(56) References Cited

U.S. PATENT DOCUMENTS

| 6,022,770 A | 2/2000 | Hook |
| 8,658,997 B2 * | 2/2014 | Chiang ............... H01L 45/1253 257/2 |

(Continued)

*Primary Examiner* — Bradley K Smith
*Assistant Examiner* — David Goodwin

(57) ABSTRACT

Provided are memory cells, such as resistive random access memory (ReRAM) cells, each cell having multiple metal oxide layers formed from different oxides, and methods of manipulating and fabricating these cells. Two metal oxides used in the same cell have different dielectric constants, such as silicon oxide and hafnium oxide. The memory cell may include electrodes having different metals. Diffusivity of these metals into interfacing metal oxide layers may be different. Specifically, the lower-k oxide may be less prone to diffusion of the metal from the interfacing electrode than the higher-k oxide. The memory cell may be formed to different stable resistive levels and then resistively switched at these levels. Each level may use a different switching power. The switching level may be selected a user after fabrication of the cell and in, some embodiments, may be changed, for example, after switching the cell at a particular level.

15 Claims, 7 Drawing Sheets

(56) References Cited

U.S. PATENT DOCUMENTS

| | | | | |
|---|---|---|---|---|
| 8,681,530 | B2* | 3/2014 | Wang | G11C 13/0007 |
| | | | | 257/2 |
| 8,817,524 | B2* | 8/2014 | Wang | H01L 45/145 |
| | | | | 257/2 |
| 8,866,121 | B2* | 10/2014 | Wang | H01L 45/1233 |
| | | | | 257/2 |
| 8,975,613 | B1* | 3/2015 | Kuse | G11C 13/0007 |
| | | | | 257/148 |
| 9,224,950 | B2* | 12/2015 | Wang | H01L 45/08 |
| 2009/0272962 | A1 | 11/2009 | Kumar et al. | |
| 2011/0182104 | A1 | 7/2011 | Kim | |

* cited by examiner

TWO STAGE FORMING OF RESISTIVE RANDOM ACCESS MEMORY CELLS

BACKGROUND

Nonvolatile memory is computer memory capable of retaining stored information even when unpowered. Nonvolatile memory is typically used for secondary storage or long-term persistent storage and may be used in addition to volatile memory, which loses the stored information when unpowered. Nonvolatile memory can be permanently integrated into computer systems (e.g., solid state hard drives) or can take the form of removable and easily transportable memory cards (e.g., USB flash drives). Nonvolatile memory is becoming more popular because of its small size/high density, low power consumption, fast reading rates and writing rates, retention, and other characteristics.

Flash memory is a common type of nonvolatile memory because of its high density and low fabrication costs. Flash memory is a transistor-based memory device that uses multiple gates per transistor and quantum tunneling for storing the information on its memory device. Flash memory uses a block-access architecture that can result in long access, erase, and write times. Flash memory also suffers from low endurance, high power consumption, and scaling limitations.

The constantly increasing speed of electronic devices and storage demand drive new requirements for nonvolatile memory. For example, nonvolatile memory is expected to replace hard drives in many new computer systems. However, transistor-based flash memory is often inadequate to meet the requirements for nonvolatile memory. New types of memory, such as resistive random access memory, are being developed to meet these demands and requirements.

SUMMARY

Provided are memory cells, such as resistive random access memory (ReRAM) cells, each cell having multiple metal oxide layers formed from different oxides, and methods of manipulating and fabricating these cells. Specifically, a memory cell includes a layer formed from a first metal oxide and another layer formed from a second metal oxide having a different dielectric constant than the first metal oxide. In one example, one layer may be formed from silicon oxide, while another layer may be formed from hafnium oxide. Furthermore, the memory cell may include electrodes having different metals. Diffusivity of one metal in one electrode into an interfacing metal oxide layer may be less than diffusivity of the other metal in the other electrode into a metal oxide layer interfacing this other electrode. Specifically, the lower-k oxide may be less prone to diffusion of the metal from the interfacing electrode than the higher-k oxide in the same cell. The memory cell having such structures may be formed to different stable resistive levels and may switch at these levels by switching resistance of the cell between its low resistive state and high resistive state at each one of these levels. Each level may use a different switching power. Furthermore, the memory cell may be programmed by a user to switch at either one of these levels after fabrication of the cell. In some embodiments, the switching level may be changed.

In some embodiments, a memory cell includes a first layer, a second layer, a third layer, and a fourth layer. The first layer is operable as an electrode. The second layer includes a first oxide. The third layer includes a second oxide. The fourth layer is operable as another electrode. The second layer directly interfaces the first layer, while the third layer directly interfaces the fourth layer. The second and third layers are disposed between the first layer and the fourth layer. The first layer includes a first metal, while the fourth layer comprises a second metal. The diffusivity of the first metal into the second layer is less than diffusivity of the second metal into the third layer. Furthermore, the dielectric constant of the second oxide is greater than the dielectric constant of the first oxide.

In some embodiments, a combination of the second layer and the third layer is operable to reversibly switch between a low resistive state and a high resistive state in response to applying a switching signal to the memory cell. This switching may be performed at different switching levels each associated with a different set of low resistive and high resistive states. For example, the combination of first and second layers is operable to form multiple low resistive states, each associated with a different switching level. The multiple low resistive states are formed in response to applying different forming signals to the memory cell. A forming step, during which a forming signal is applied to the memory cell to bring the memory cell to a new level, should be distinguished from a switching step, during which a switching signal is applied to the ReRAM cell to change the resistive state of the memory cell within the same switching level. Applying a forming signal to the memory cell comprises maintaining a higher potential at the first layer than at the fourth layer, which reduces diffusion of the second metal into the third layer at least during the forming step.

In some embodiments, the first oxide is silicon oxide, while the second oxide is hafnium oxide. The first oxide and the second oxide may be sub-stoichiometric oxides. For example, the first oxide may be $SiO_x$, wherein the second oxide may be $HfO_y$, such that the values of both X and Y are between 1.7 and 1.9. For purposes of this disclosure and unless specifically noted, the term "oxide" refers to both stoichiometric oxides and sub-stoichiometric oxides.

In some embodiments, the first metal is one of tantalum, tungsten, or platinum. The first layer may also include one or more of nitrogen and silicon. For example, the first layer may be TaN, TaSiN, WN, WSiN, or combinations thereof. In some embodiments, the second metal is titanium. The second layer may also include one or more of nitrogen and silicon. For example, the first layer may be TiN or TiSiN.

In some embodiments, the memory cell also includes a fifth layer operable to maintain a constant resistance when a switching signal or a forming signal is applied to the memory cell to reversibly switch a combination of the second layer and the third layer between a low resistive state and a high resistive state. The fifth layer may be referred to as an embedded resistor. The fifth layer may be disposed between the second layer and the third layer.

In some embodiments, the thickness of the second layer is less than the thickness of the third layer. For example, the thickness of the second layer may be between about 25% and 75% of the third layer thickness, or more specifically, between about 25% and 50% of the third layer thickness.

In some embodiments, the dielectric constant of the second oxide is at least three times greater than the dielectric constant of the first oxide. For example, the dielectric constant of the second oxide may be between about 15 and 30, while the dielectric constant of the first oxide may be between about 3 and 10. The dielectric constant difference allows achieving different switching levels.

In some embodiments, the first metal is tantalum. The first layer also includes nitrogen bound to the first metal. The first oxide includes one or both of silicon oxide and aluminum oxide. The second oxide includes hafnium oxide. The second metal is titanium. The second layer also includes nitrogen bound to the second metal.

Provided also is a method of manipulating a memory cell including a first layer, second layer, third layer, and fourth layer. The first layer is operable as an electrode. The second layer includes a first oxide. The third layer includes a second oxide. The fourth layer is operable as an electrode. The second layer directly interfaces the first layer. The third layer directly interfaces the fourth layer. The first layer includes a first metal. The fourth layer includes a second metal. The diffusivity of the first metal into the second layer is less than diffusivity of the second metal into the third layer. The second oxide has a higher dielectric constant than the first oxide. The method involves applying a first forming signal between the first layer and the fourth layer such that applying the first forming signal changes a resistance of the second layer to a first low resistance while the resistance of the third layer remains substantially the same. Applying the first forming signal involves applying a higher potential to the first layer than to the fourth layer. In other words, applying the first forming signal changes the switching level of the memory cell. The starting switching level in this step may be an initial switching level that exists after fabrication of the cell, in which case this step may be referred to as an initial forming step. It should be noted that the cell may be brought to a desired switching level in a single step or a number of forming steps. For example, the cell may be subjected to a number of forming steps without any switching (at any switching level) in between.

In some embodiments, the method also involves switching the resistance of the second layer between the first low resistance and a first high resistance. The resistance of the second layer in the first low resistance is less than the resistance of the second layer in the first high resistance. The resistance of the third layer may not change during these switching steps if the third layer has not been previously formed. Alternatively, the resistance of the third layer may change together with the resistance of the second layer during these switching steps. As such, each switching level depends on the previous forming step and the state of each oxide containing layer at the end of this forming step.

In some embodiments, the method also involves applying a second forming signal between the first layer and the fourth layer. Applying the second forming signal changes a resistance of the third layer to a second low resistance. Applying the second forming signal involves applying a higher potential to the first layer than to the fourth layer. Applying the second forming signal further changes a resistance of the second layer to a third low resistance such that the third low resistance is less than the first low resistance. The second forming signal may applied immediately after applying the first forming signal thereby bringing the cell from the first switching level to the second switching level. Alternatively, the cell may be switched at the first switching level (e.g., switched between its two resistive switching states corresponding to the first switching level) before applying the second forming signal.

In some embodiments, the method also involves switching the resistance of the third layer between the second low resistance and a second high resistance. In other words, the cell may be switched at the second switching level. The resistance of the third layer in the second low resistance is less than the resistance of the third layer in the second high resistance. Switching the resistance of the third layer from the second low resistance to the second high resistance corresponds to switching the resistance of the second layer from the third low resistance to a third high resistance corresponds. Switching the resistance of the third layer from the second high resistance to the second low resistance corresponds to switching the resistance of the second layer from the third high resistance to the third low resistance corresponds. The resistance of the second layer in the third low resistance is less than the resistance of the second layer in the third high resistance.

These and other embodiments are described further below with reference to the figures.

BRIEF DESCRIPTION OF THE DRAWINGS

To facilitate understanding, the same reference numerals have been used, where possible, to designate common components presented in the figures. The drawings are not to scale and the relative dimensions of various elements in the drawings are depicted schematically and not necessarily to scale. Various embodiments can readily be understood by considering the following detailed description in conjunction with the accompanying drawings.

DETAILED DESCRIPTION

Figure 1A:
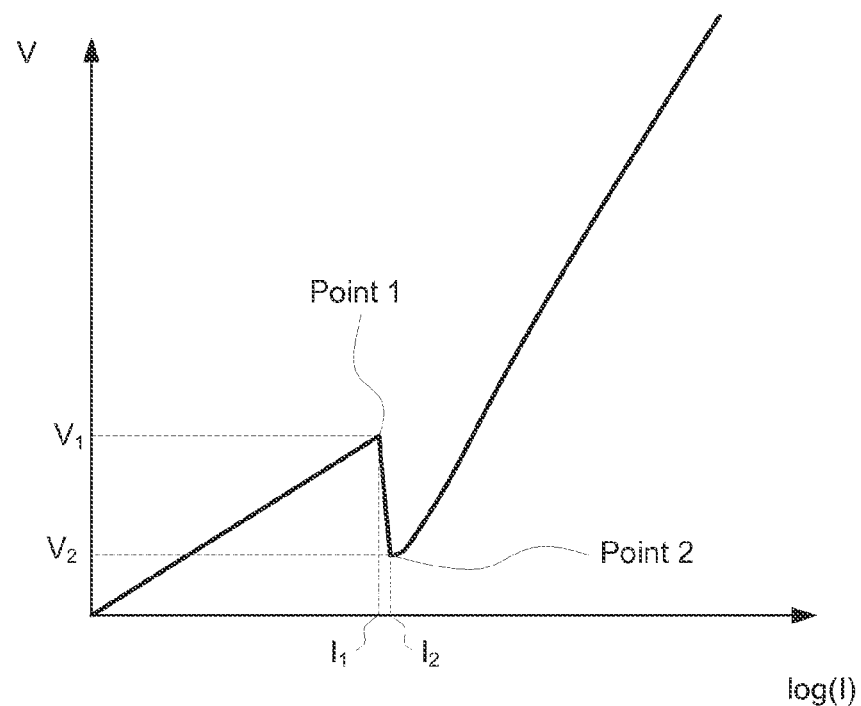
FIG. 1A illustrates a plot of an electrical forming in a conventional dielectric, in accordance with some embodiments.

A detailed description of various embodiments is provided below along with accompanying figures. The detailed description is provided in connection with such embodiments, but is not limited to any particular example. The scope is limited only by the claims and numerous alternatives, modifications, and equivalents are encompassed.

Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Introduction

A ReRAM cell exhibiting resistive switching characteristics generally includes multiple layers formed into a stack, such as a "metal-insulator-metal" (MIM) stack. The stack includes two conductive layers operable as electrodes. The layers are identified with letter "M" in the MIM stack and may include one or more metals or other types of conductive materials, such as doped silicon. The stack also includes one or more insulator layers identified as "I" in the MIM stack. The one or more dielectric layers are configured to change their resistive properties when a switching signal is applied to the dielectric layers or, more generally, between the electrodes. Due to their variable resistance characteristics, the dielectric layers may be also referred to as a variable resistance layer. These changes in resistive properties are used to store data. For example, when two different resistive states are identified (e.g., a high resistive state and a low resistive state) for a ReRAM cell, one state may be associated with a logic "zero", while the other state may be associated with a logic "one" value. Similar approaches may be used when three or more resistive states may be identified for the same ReRAM cell leading to various multibit architectures.

In general, it is desirable to have more resistive states thereby increasing the data storage capacity of ReRAM cells. For example, four resistive states may be used to store two bits of data and so on. Furthermore, it may be desirable to have multiple pairs of different resistive states that use different switching power, i.e., multiple different switching levels. For example, the same ReRAM cell may be configured, as further described below, to switch between a first pair of resistive states using a first power (at a first switching level) and between a second pair of resistive states using a second power level (at a second switching level). Switching powers needed to switch the cell at these switching levels may be different. Furthermore, switching levels may have different characteristics, such as data retention. Different switching levels may be achieved by using different forming signals. Furthermore, the switching level of the cell may be changed. For example, a ReRAM cell may be first formed such that it can switch in the first switching level. This cell may be later formed again such that it can now switch at the second switching level. In some embodiments, the cell may be switched back to the first switching level after it is brought to the second switching level.

After a ReRAM cell is formed into a particular switching level, it may be manipulated at this level by switching between a pair of distinct resistive states. The switching signal may be applied as series of voltage pulses and may be generally referred to as switching voltage profiles or, more specifically, "set" voltage profiles and "reset" voltage profiles. For example, a switching voltage pulse may be used to change ("set" or "reset") the resistive state followed by a smaller reading voltage pulse to determine the current state of the ReRAM cell at that time. Unlike the switching voltage pulse, the reading pulse is specifically configured to avoid changing the resistive state of the ReRAM cell and is configured only to determine the current state. The switching pulse may be repeated if the desired resistive state is not reached. The switching pulses may alternate with the reading pulses for feedback control. The switching pulses may vary from one to another based on their potential (e.g., a gradual increase in the potential), duration, and other characteristics. The reading pulses may be the same. The process of applying the switching pulses and reading pulses may continue until the desired resistive state is reached.

Similar to resistive switching at a switching level, forming involves applying one or more voltage pluses to a ReRAM cell. As further described below with reference to FIGS. 2A and 2B, forming is an electrical forming process that occurs in one or more resistive switching layers of the ReRAM cell. An examples of a typical forming process is shown in FIG. 1A by a transition from Point 1 to Point 2. Before the ReRAM cell can be switched two resistive states, an initial conductive path is formed through at least one of the resistive switching layers. Later this conductive path is modified to achieve resistive switching. There are two modes of dielectric forming in resistive switching layers, which may be referred to as soft-forming and hard-forming. These two modes associated with different changes in voltage and/or current during forming step. The hard forming may be characterized by a large change in voltage and/or current during the forming transient. The soft forming may be characterized by much smaller change of voltage and/or current during the forming. Even during the soft forming, the leakage current increases and forms conductive paths. However, the density of these conductive paths after the soft forming is much less than after the hard forming. The soft forming paves the way to the hard forming but only partially redistributes materials within the resistive switching layer. In contrast with the soft forming, the hard forming may occur after the soft forming due to, for example, thermal meltdown and more dense conductive paths are formed during the hard forming. The hard forming generates more defects in comparison to the soft forming. As such, more and larger conductive filaments are formed from defects during the hard forming resulting in much lower resistance then when the soft forming is used.

Forming involves applying a strong electric field to the resistive switching layer, which brings the resistive switching layer close to the dielectric forming. The set step described below with reference to FIG. 2B shows a conductive path made up of defects (e.g., trapped charges) formed between the two electrodes. The reset step described below with reference to FIG. 2C shows partial break of the conductive path formed in FIG. 2B. The set and reset switching steps may be repeated as show in FIG. 2B and FIG. 2C. As noted above, the density of these conductive paths as well as other characteristics (e.g., the size) may be different for resistive switching layers that undergone the soft forming vs. resistive switching layers that undergone the hard forming. The forming process may be controlled by external circuitry and/or on chip circuitry (e.g., a selector transistor) to prevent over-programming and to bring the cell into a desired switching level.

Forming process as well as overall performance of a ReRAM cell is affected by materials used for resistive switching layers and, in some embodiments, electrodes. For example, different materials for multiple resistive switching layers in the same ReRAM cell may be selected. The less diffusive electrode may interface the lower-k dielectric (e.g., a lower-k oxide), while the more diffusive electrode may interface the higher-k dielectric (e.g., a higher-k oxide). Specifically, the diffusivity of the first electrode to its contiguous layer (e.g., lower-k oxide) is less than the diffusivity of the second electrode to its contiguous layer (e.g., higher-k oxide). The combination of multiple resistive switching layers between two different electrodes may provide multiple low resistive states that are stable depending on different forming signals. Based on the orientation of the layers described above, the forming signals may be associated with a higher potential at the first electrode than the second electrode. Due to such potential difference on the two electrodes, the diffusion of metal ions from the first oxide to the second oxide may decrease. In general, the forming strength decreases as the dielectric constant increases. Therefore, the forming in the first oxide (lower-k) may precede the forming in the second oxide (higher-k). To some extent this forming may be impacted by the diffusion or, more specifically, by controlling the diffusion. In addition, considering that the lower-k oxide may potentially cause tunneling leakage or intrinsic reliability concerns in the cell, the higher-k oxide in the cell may act as barrier materials to prevent harmful diffusion to neighboring layers.

A ReRAM cell including multiple resistive switching layers having different materials, in particular materials having different dielectric constants, may undergo multiple electrical forming operations. Materials having higher dielectric constants generally have lower forming voltages (which sometimes may be referred to as breakdown voltage). For the same kind of oxide, addition of metal (and shifting further away from the stoichiometric oxide) will reduce the forming voltage. For example, a stoichiometric silicon dioxide ($SiO_2$) has a breakdown field of about 10-12 MV/cm. Adding silicon can reduce this breakdown field to about 6 MV/cm.

For example, a ReRAM cell may include a hafnium oxide resistive switching layer and silicon oxide resistive switching layer disposed between a titanium nitride electrode and tantalum nitride electrode. The titanium nitride electrode may directly interface the hafnium oxide resistive switching layer, while the tantalum nitride electrode may directly interface the silicon oxide resistive switching layer. As such, the hafnium oxide resistive switching layer and silicon oxide resistive switching layer are connected in series. During forming step, the silicon oxide resistive switching layer may form first because of its lower dielectric constant. Silicon oxide is more resistive than hafnium oxide and, as a result, will form first. During formation of silicon oxide, the voltage applied to hafnium oxide will increase causing it to form later. Specifically, the dielectric constant of silicon oxide is between about 3.5-4.5 depending on the stoichiometric ratio of silicon and oxygen, dopants, and other factors. The dielectric constant of hafnium oxide is between about 15-20 also depending on the stoichiometric ratio of hafnium and oxygen, dopants, and other factors. The beginning of the silicon oxide forming is depicted with Point 3 in FIG. 1B.

Figure 1B:
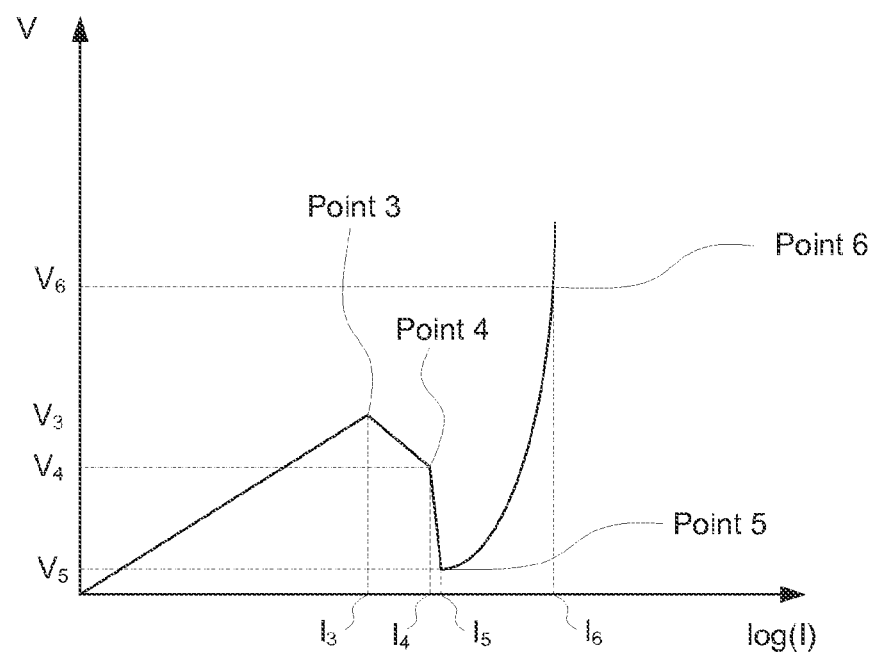
FIG. 1B illustrates a plot of an electrical forming in a ReRAM cell having two layers formed from different oxides having different dielectric constants, in accordance with some embodiments.

Continuing the forming process may further reduce the resistance of the silicon oxide layer by forming more conductive paths in the silicon oxide layer as shown by the transition from Point 3 to Point 4 in FIG. 1B. As such, if Point 3 in FIG. 1B is the forming end point, then the silicon oxide layer is generally unformed or partially formed resulting in ultra-low power (ULP) switching. As further described below with reference to FIGS. 2A and 2B, very few conductive paths exists at this point in the silicon oxide layer and these paths are relatively easy to break and reform during switching step. On the other hand, these paths may be unstable resulting in poor data retention. If better data retention is needed, then the forming process may continue to Point 4 in FIG. 1B. At this point, the silicon oxide layer is mostly formed. However, the hafnium oxide layer may be substantially unformed leading to low power (LP) switching. The LP switching may require more power than the ULP switching but still less power than switching at Point 5 or at Point 6 in FIG. 1B.

The abrupt change at the transition from Point 4 to Point 5 in FIG. 1B corresponds to forming of hafnium oxide. Specifically, at Point 5 in FIG. 1B both the hafnium oxide layer and silicon oxide layer are formed resulting in medium power (MP) switching. This state may be referred to soft forming. If the forming process continues, both the hafnium oxide layer and silicon oxide layer may be hard formed leading to high power (HP) switching as shown by Point 6 in FIG. 1B.

Various conditions of these forming and switching steps points may be controlled by selecting specific materials for resistive switching layers and electrodes. Other factors influencing these conditions include thicknesses of resistive switching layers, additional resistance from other components in a stack (e.g., an embedded resistor), and outside of the stack (e.g., signal lines, external current steering elements). A series of experiments have been conducted to determine impact of some of these factors. For example, increasing the thickness of the silicon oxide layer from 5 Angstroms to 10 Angstroms resulted in increase of the current. It should be noted that the composition impacts the breakdown field. The forming voltage is a product of the breakdown field and thickness. For example, a 10 Angstrom thick silicon oxide layer may have a forming voltage of about 3V, while a 30 Angstrom thick hafnium oxide layer may have a forming voltage of about 1V.

Another experiment compared a combination of titanium nitride and tantalum nitride electrodes to a combination of two tantalum nitride electrodes. The titanium nitride electrode was directly interfacing a hafnium oxide resistive switching layer. The change from the two tantalum nitride electrodes to the combination of titanium nitride and tantalum nitride electrodes resulted in an increase of forming current by about 0.5V to 1V. Furthermore, ReRAM cells built with two tantalum nitride electrodes had more distinct multi-stage forming behavior than ReRAM cells built with the combination of titanium nitride and tantalum nitride electrodes. Without being restricted to any particular theory, it is believed that when a titanium nitride electrode directly interfaces with a hafnium oxide resistive switching layer, some titanium may diffuse into the resistive switching layer.

In another experiment, both sets of ReRAM cells had titanium nitride and tantalum nitride electrodes with hafnium oxide and silicon oxide resistive switching layers disposed between these electrodes. However, in one set, the hafnium oxide resistive switching layer was directly interfacing the titanium nitride electrode (while the silicon oxide resistive switching layer was directly interfacing the tantalum nitride electrode), i.e., $TiN/HfO_x/SiO_x/TaN$ cells. In other set, the silicon oxide resistive switching layer was directly interfacing the titanium nitride electrode (while the hafnium oxide resistive switching layer was directly interfacing the tantalum nitride electrode), i.e., $TiN/SiO_x/HfO_x/TaN$ cells. The $TiN/HfO_x/SiO_x/TaN$ cells had more abrupt forming while the $TiN/SiO_x/HfO_x/TaN$ cells had more gradual forming. Without being restricted to any particular theory, it is believed that diffusion of titanium hafnium in $TiN/HfO_x/SiO_x/TaN$ cells has a greater effect on the overall forming characteristics. In these cells $HfO_x$ is operable as an oxygen vacancy reservoir. The diffusion of titanium in $HfO_x$ will help with with extracting oxygen ions from $HfO_x$ and increase the density of oxygen vacancy in $HfO_x$.

Adding a layer between the electrodes, such that this new layer is capable of maintaining a stable resistance during the forming process, can also impact the formation process and the resulting performance of the cell. This stable resistance layer may be referred to as an embedded resistor or a current-limiting element. Two sets of ReRAM cells have been tested, both having TiN/HfO$_x$/SiO$_x$/TaN. Each cell in one set included a 9 kΩ embedded resistor, while each cell in the other set included a 116 kΩ embedded resistor The cells with the 9 kΩ embedded resistors demonstrated more abrupt forming behavior than the cells with the 116 kΩ embedded resistors. Without being restricted to any particular theory, it is believed that the embedded resistor acts as a current limited during the forming process thereby preventing over-programming.

Examples of Nonvolatile ReRAM Cells and their Switching Mechanisms

A brief description of ReRAM cells is provided for context and better understanding of various features associated forming and operatively switching ReRAM cells. As stated above, a ReRAM cell includes a dielectric material formed into a layer exhibiting resistive switching characteristics. A dielectric, which is normally insulating, can be made to conduct through one or more conductive paths formed after application of a voltage. The conductive path formation can arise from different mechanisms, including defects, metal migration, and other mechanisms further described below. Once one or more conductive paths (e.g., filaments) are formed in the dielectric component of a memory device, these conductive paths may be reset (or broken resulting in a high resistance) or set (or re-formed resulting in a lower resistance) by applying certain voltages. Without being restricted to any particular theory, it is believed that resistive switching corresponds to migration of defects within the resistive switching layer and, in some embodiments, across one interface formed by the resistive switching voltage, when a switching voltage is applied to the layer.

Figure 2A:
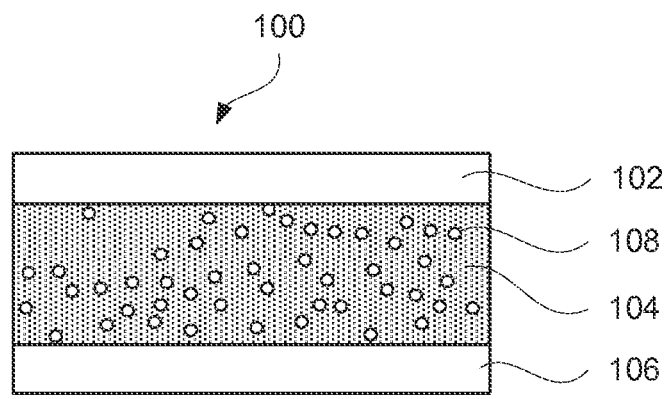
FIG. 2A illustrates a schematic representation of a ReRAM cell prior to initial forming step, in accordance with some embodiments.
Figure 2B:
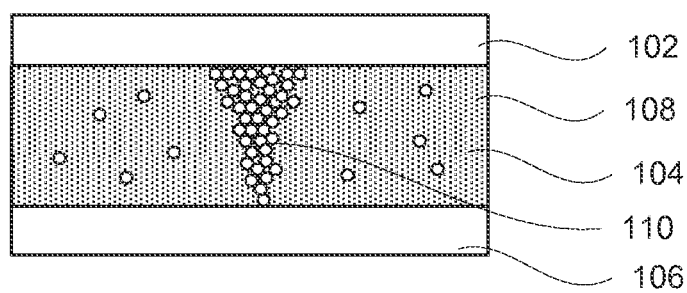
FIGS. 2B and 2C illustrate schematic representations of the ReRAM cell in its high resistive state (HRS) and low resistive state (LRS), in accordance with some embodiments.
Figure 2C:
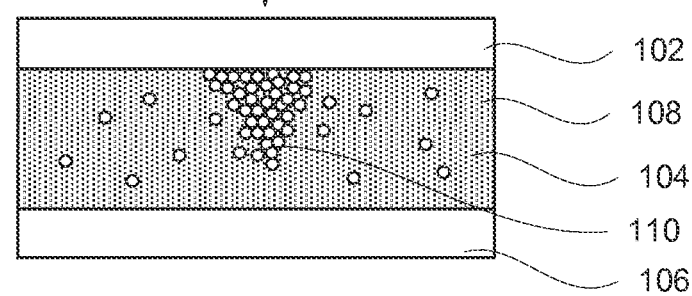

FIG. 2A illustrates a schematic representation of ReRAM cell 100 including first electrode 102, second electrode 106, and resistive switching layer 104 disposed in between first electrode 102 and second electrode 106. It should be noted that the "first" and "second" references for electrodes 102 and 106 are used solely for differentiation and not to imply any processing order or particular spatial orientation of these electrodes. ReRAM cell 100 may also include other components, such as an embedded resistor, diode, diffusion barrier layer, and other components. ReRAM cell 100 is sometimes referred to as a memory element or a memory unit.

First electrode 102 and second electrode 106 may be used as conductive lines within a memory array or other types of devices that ReRAM cell is integrated into. As such, electrode 102 and 106 are generally formed from conductive materials. As stated above, one of the electrodes may be reactive electrode and act as a source and as a reservoir of defects for the resistive switching layer. That is, defects may travel through an interface formed by this electrode with the resistive switching layer (i.e., the reactive interface).

Resistive switching layer 104 which may be initially formed from a dielectric material and later can be made to conduct through one or more conductive paths formed within the layer by applying first a forming voltage and then a switching voltage. To provide this resistive switching functionality, resistive switching layer 104 includes a concentration of electrically active defects 108, which may be at least partially provided into the layer during its fabrication. For example, some atoms may be absent from their native structures (i.e., creating vacancies) and/or additional atoms may be inserted into the native structures (i.e., creating interstitial defects). Charge carriers may be also introduced as dopants, stressing lattices, and other techniques. Regardless of the types all charge carriers are referred to as defects 108.

FIG. 2A is a schematic representation of ReRAM cell 100 prior to initial formation of conductive paths, in accordance with some embodiments. Resistive switching layer 104 may include some defects 108. Additional defects 108 may be provided within first electrode 102 and may be later transferred to resistive switching layer 104 during the formation step. In some embodiments, the resistive switching layer 104 has substantially no defects prior to forming step and all defects are provided from first electrode 102 during forming. Second electrode 106 may or may not have any defects. It should be noted that regardless of presence or absence of defects in second electrode 106, substantially no defects are exchanged between second electrode 106 and resistive switching layer 104 during forming and/or switching steps.

During the forming step, ReRAM cell 100 changes its structure from the one shown in FIG. 2A to the one shown in FIG. 2B. This change corresponds to defects 108 being arranged into one or more continuous paths within resistive switching layer 104 as, for example, schematically illustrated in FIG. 2B. Without being restricted to any particular theory, it is believed that defects 108 can be reoriented within resistive switching layer 104 to form these conductive paths as, for example, schematically shown in FIG. 2B. Furthermore, some or all defects 108 forming the conductive paths may enter resistive switching layer 104 from first electrode 102. For simplicity, all these phenomena are collectively referred to as reorientation of defects within ReRAM cell 100. This reorientation of defects 108 occurs when a certain forming voltage is applied to electrodes 102 and 106. In some embodiments, the forming step also conducted at elevated temperatures to enhanced mobility of the defects within ReRAM cell 100.

Resistive switching involves breaking and reforming conductive paths through resistive switching layer 104, i.e., switching between the state schematically illustrated in FIG. 2B and the state schematically illustrated in FIG. 2C. The resistive switching is performed by applying switching voltages to electrodes 102 and 106. Depending on magnitude and polarity of these voltages, conductive path 110 may be broken or formed back again. These voltages may be substantially lower than forming voltages (i.e., voltages used in the forming step) since much less mobility of defects is needed during switching steps. For example, hafnium oxide based resistive layers may need about 7 Volts during their forming but can be switched using voltages less than 4 Volts.

The state of resistive switching layer 104 illustrated in FIG. 2B is referred to as a low resistance state (LRS), while the state illustrated in FIG. 2C is referred to as a high resistance state (HRS). The resistance difference between the LRS and HRS is due to different number and/or conductivity of conductive paths that exists in these states, i.e., resistive switching layer 104 has more conductive paths and/or less resistive conductive paths when it is in the LRS than when it is in the HRS. It should be noted that resistive switching layer 104 may still have some conductive paths while it is in the HRS, but these conductive paths are fewer and/or more resistive than the ones corresponding to the LRS.

When switching from its LRS to HRS, which is often referred to as a reset step, resistive switching layer 104 may release some defects into first electrode 102. Furthermore, there may be some mobility of defects within resistive switching layer 104. This may lead to thinning and, in some embodiments, breakages of conductive paths as shown in FIG. 2C. Depending on mobility within resistive switching layer 104 and diffusion through the interface formed by resistive switching layer 104 and first electrode 102, the conductive paths may break closer to the interface with second electrode 106, somewhere within resistive switching layer 104, or at the interface with first electrode 102. This breakage generally does not correspond to complete dispersion of defects forming these conductive paths and may be a self-limiting process, i.e., the process may stop after some initial breakage occurs.

When switching from its HRS to LRS, which is often referred to as a set step, resistive switching layer 104 may receive some defects from first electrode 102. Similar to the reset step described above, there may be some mobility of defects within resistive switching layer 104. This may lead to thickening and, in some embodiments, reforming of conductive paths as shown in FIG. 2B. In some embodiments, a voltage applied to electrodes 102 and 106 during the set step has the same polarity as a voltage applied during the reset step. This type of switching is referred to as unipolar switching. Alternatively, a voltage applied to electrodes 102 and 106 during the set step may have different polarity as a voltage applied during the reset step. This type of switching is referred to as bipolar switching. Setting and resetting steps may be repeated multiple times as will now be described with reference to FIGS. 2D and 2E.

Figure 2D:
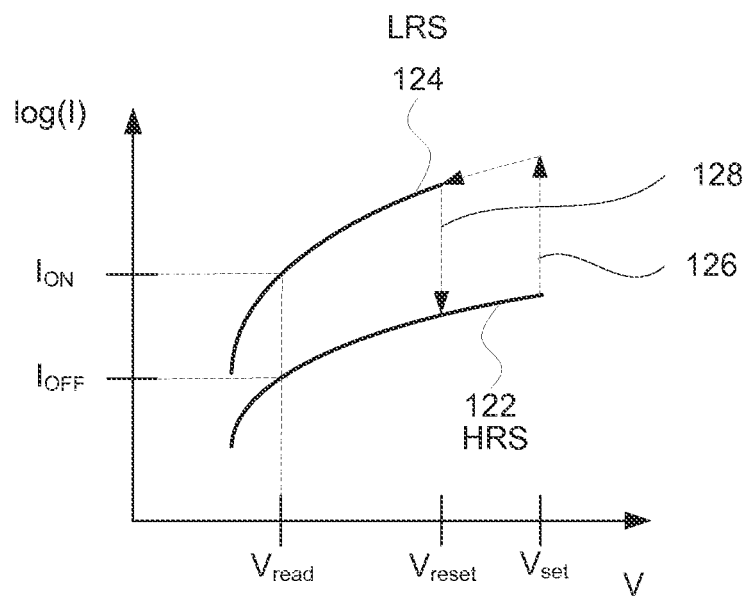
FIG. 2D illustrates a plot of a current passing through a unipolar ReRAM cell as a function of a voltage applied to the ReRAM cell, in accordance with some embodiments.
Figure 2E:
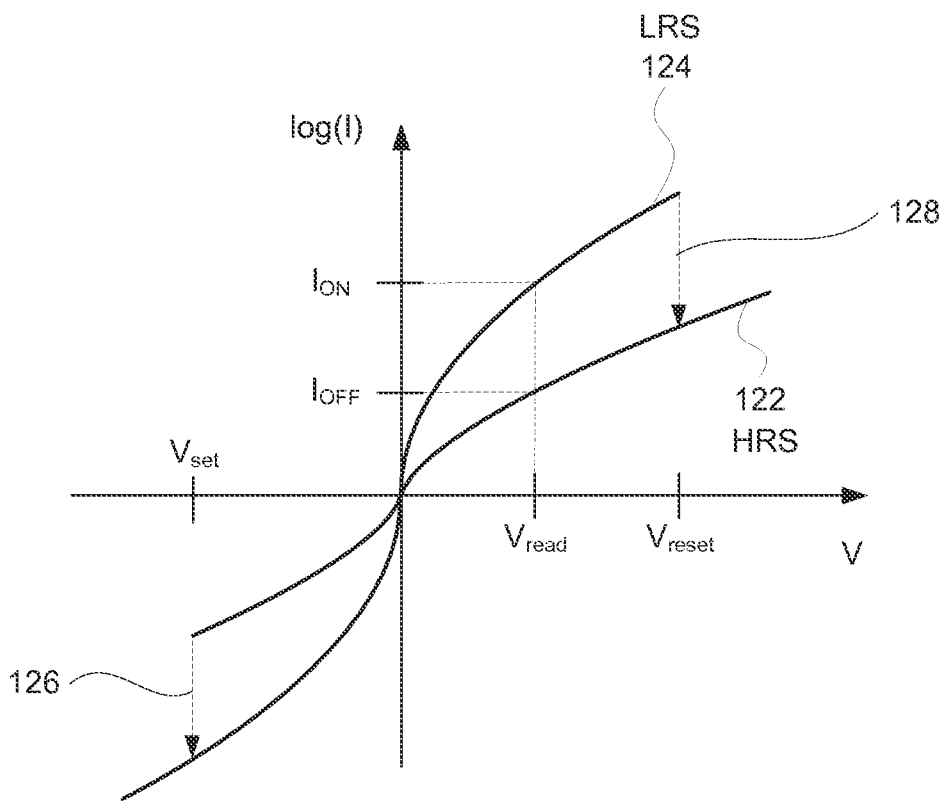
FIG. 2E illustrates a plot of a current passing through a bipolar ReRAM cell as a function of a voltage applied to the ReRAM cell, in accordance with some embodiments.

Specifically, FIG. 2D illustrates a plot of a current passing through a unipolar ReRAM cell as a function of a voltage applied to the ReRAM cell, in accordance with some embodiments. FIG. 2E illustrates the same type of a plot for a bipolar ReRAM cell, in accordance with some embodiments. The HRS is defined by line 122, while the LRS is defined by 124 in both plots. Each of these states is used to represent a different logic state, e.g., the HRS may represent logic one ("1") and LRS representing logic zero ("0") or vice versa. Therefore, each ReRAM cell that has two resistance states may be used to store one bit of data. It should be noted that some ReRAM cells may have three and even more resistance states allowing multi-bit storage in the same cell.

The overall manipulation of the ReRAM cell may be divided into a read step, set step (i.e., turning the cell "ON" by changing from its HRS to LRS), and reset step (i.e., turning the cell "OFF" by changing from its LRS to HRS). During the read step, the state of the ReRAM cell or, more specifically, the resistive state of its resistance of resistive switching layer can be sensed by applying a sensing voltage to its electrodes. The sensing voltage is sometimes referred to as a "READ" voltage or simply a reading voltage and indicated as $V_{READ}$ in FIGS. 2D and 2E. If the ReRAM cell is in its HRS (represented by line 122 in FIGS. 2D and 2E), the external read and write circuitry connected to the electrodes will sense the resulting "OFF" current ($I_{OFF}$) that flows through the ReRAM cell. As stated above, this read step may be performed multiple times without changing the resistive state (i.e., switching the cell between its HRS and LRS). In the above example, the ReRAM cell should continue to output the "OFF" current ($I_{OFF}$) when the read voltage ($V_{READ}$) is applied to the electrodes for the second time, third time, and so on.

Continuing with the above example, when it is desired to turn "ON" the cell that is currently in the HRS switch, a set step is performed. This step may use the same read and write circuitry to apply a set voltage ($V_{SET}$) to the electrodes. Applying the set voltage forms one or more conductive paths in the resistive switching layer as described above with reference to FIGS. 2B and 2C. The switching from the HRS to LRS is indicated by dashed line 126 in FIGS. 2D and 2E. The resistance characteristics of the ReRAM cell in its LRS are represented by line 124. When the read voltage ($V_{READ}$) is applied to the electrodes of the cell in this state, the external read and write circuitry will sense the resulting "ON" current ($I_{ON}$) that flows through the ReRAM cell. Again, this read step may be performed multiple times without switching the state of the ReRAM cell.

At some point, it may be desirable to turn "OFF" the ReRAM cell by changing its state from the LRS to HRS. This step is referred to as a reset step and should be distinguished from set step during which the ReRAM cell is switched from its HRS to LRS. During the reset step, a reset voltage ($V_{RESET}$) is applied to the ReRAM cell to break the previously formed conductive paths in the resistive switching layer. Switching from a LRS to HRS is indicated by dashed line 128. Detecting the state of the ReRAM cell while it is in its HRS is described above.

Overall, the ReRAM cell may be switched back and forth between its LRS and HRS many times. Read steps may be performed in each of these states (between the switching steps) one or more times or not performed at all. It should be noted that application of set and reset voltages to change resistance states of the ReRAM cell involves complex mechanisms that are believed to involve localized resistive heating as well as mobility of defects impacted by both temperature and applied potential.

In some embodiments, the set voltage ($V_{SET}$) is between about 100 mV and 10V or, more specifically, between about 500 mV and 5V. The length of set voltage pulses ($t_{SET}$) may be less than about 100 milliseconds or, more specifically, less than about 5 milliseconds and even less than about 100 nanoseconds. The read voltage ($V_{READ}$) may be between about 0.1 and 0.5 of the write voltage ($V_{SET}$). In some embodiments, the read currents ($I_{ON}$ and $I_{OFF}$) are greater than about 1 mA or, more specifically, is greater than about 5 mA to allow for a fast detection of the state by reasonably small sense amplifiers. The length of read voltage pulse ($t_{READ}$) may be comparable to the length of the corresponding set voltage pulse ($t_{SET}$) or may be shorter than the write voltage pulse ($t_{RESET}$). ReRAM cells should be able to cycle between LRS and HRS between at least about $10^3$ times or, more specifically, at least about $10^7$ times without failure. A data retention time ($t_{RET}$) should be at least about 5 years or, more specifically, at least about 10 years at a thermal stress up to 85° C. and small electrical stress, such as a constant application of the read voltage ($V_{READ}$). Other considerations may include low current leakage, such as less than about 40 A/cm² measured at 0.5 V per 20 Å of oxide thickness in HRS.

Examples of ReRAM Cells

Figure 3A:
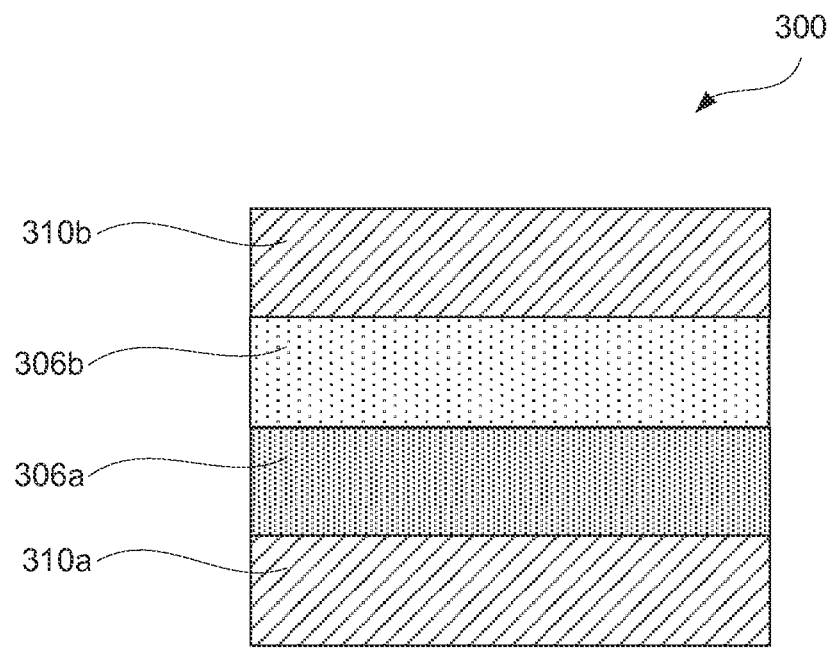
FIG. 3A illustrates a schematic representation of a ReRAM cell including two layers formed from different oxides having different dielectric constants, in accordance with some embodiments.

FIG. 3A illustrates a schematic representation of ReRAM cell 300, in accordance with some embodiments. ReRAM cell 300 may include first layer 310a operable as an electrode, second layer 306a operable as a resistive switching layer, third layer 306b operable as another resistive switching layer, and fourth layer 310b operable as another electrode. Second layer 306a and third layer 306b are disposed between first layer 310a and fourth layer 310b as, for example, shown in FIG. 3A. In some embodiments, first layer 310a directly interfaces second layer 306a, while fourth layer 310b directly interfaces third layer 306b. Furthermore, second layer 306a may directly interface third layer 306b as, for example, shown in FIG. 3A. Alternatively, additional layers may be disposed between second layer 306a and third layer 306b as further described below with reference to FIG. 3B. For example, an additional layer may function as a buffer layer between a resistive switching layer and electrode.

First layer 310a includes a first metal. Fourth layer 310b includes a second metal. In some embodiments, the first metal and second metal are the same. For example, both metals may be tantalum. Alternatively, the first metal may be different from the second metal. For example, the first metal may be tantalum, while the second metal may be titanium.

In some embodiments, the diffusivity of the first metal into second layer 306a is less than diffusivity of the second metal into third layer 306b. For example, the diffusion coefficient (at 25° C.) of the first metal into second layer 306a is at least 10 times less than the diffusion coefficient of the second metal into third layer 306b or even 100 times less. The ability of an atom to diffuse into other structures generally depends on its atomic mass. Specifically, lighter atoms generally diffuse more readily than heavier atoms. As such, titanium (atomic mass of 47) will diffuse more rapidly than tantalum (atomic mass of 180).

The diffusivity of electrode materials into resistive switching layers has a significant impact on forming characteristics of a ReRAM cells. As described above, rearranging the same two resistive switching layers relative to the same two electrodes, i.e., TiN/SiO$_x$/HfO$_x$/TaN cells vs. TiN/HfO$_x$/SiO$_x$/TaN cells, results in difference performance. In this example, titanium is more diffusive than tantalum, while silicon oxide has a lower dielectric constant than hafnium oxide. Without being restricted to any particular theory, it is believed that the diffusion of titanium into hafnium oxide induces stronger forming characteristic than diffusion of titanium into silicon oxide.

It should be noted that diffusivity of electrode materials into an adjacent resistive switching layer may be impacted by the potential applied to the cell because this potential influences mobility of ions, such as metal ions, within the cell and between different layers. For example, an applied potential may drive the positive ions of the first metal away from the second layer. A reverse potential may cause the second metal of fourth layer 310b to diffuse into third layer 306b. As such, the potential applied during forming may be used to control diffusion of materials from electrodes into resistive switching layers and thereby control forming characteristics.

In some embodiments, the first metal is one of tantalum, tungsten, or platinum. The first layer may also include one or more of nitrogen and silicon. For example, the first layer may be TaN, TaSiN, WN, WSiN, or combinations thereof. In some embodiments, the second metal is titanium. The second layer may also include one or more of nitrogen and silicon. For example, the first layer may be TiN or TaSiN.

In some embodiments, the dielectric constant of the material of third layer 306b is greater than the dielectric constant of the material of second layer 306a. For example, the dielectric constant of the material of third layer 306b may be at least three times greater. The material of third layer 306b may be a second oxide, while the materials of second layer 306a may be a first oxide. The dielectric constant of the second oxide may be between about 15 and 30, while the dielectric constant of the first oxide may be between about 3 and 1. In some embodiments, the first oxide includes silicon oxide, while the second oxide includes hafnium oxide. The first oxide and the second oxide may be sub-stoichiometric oxides. For example, the first oxide may be SiO$_x$, wherein the second oxide may be HfO$_y$, such that the values of both X and Y are between 1.7 and 1.9.

In some embodiments, the thickness of second layer 306a is less than the thickness of third layer 306b. For example, the thickness of second layer 306a may be between about 25% and 75% of the thickness of third layer 306b or, more specifically, between about 25% and 50%. The thickness of second layer 306a may be between about 5 Angstroms and 50 Angstroms or, more specifically, between about 10 Angstroms and 30 Angstroms. The thickness of third layer 306b may be between about 10 Angstroms and 100 Angstroms or, more specifically, between about 20 Angstroms and 50 Angstroms. As described above, the thicknesses of second layer 306a and third layer 306b have significant impact on forming characteristics of ReRAM cell 300.

In some embodiments, a combination of second layer 306a and third layer 306b is operable to reversibly switch between a low resistive state and a high resistive state in response to applying a switching signal to ReRAM cell 300 as described above with references to FIGS. 1B-1C and FIGS. 2A and 2B. For example, this combination is operable to form multiple low resistive states in response to applying different forming signals to ReRAM cell 300. Applying different forming may involve maintaining a higher potential at first layer 310a than at fourth layer 310b as further described below with reference to FIG. 4B.

For example, ReRAM cell 300 may include a fifth layer operable to maintain a constant resistance when a switching signal is applied to ReRAM cell 300 to reversibly switch a combination of second layer 306a and third layer 306b between a low resistive state and a high resistive state. The fifth layer may be referred to as an embedded resistor. In some embodiments, a layer between second layer 306a and third layer 306b may serve other functions, e.g., it may be operable as a barrier layer, as a current steering element, and such.

Figure 3B:
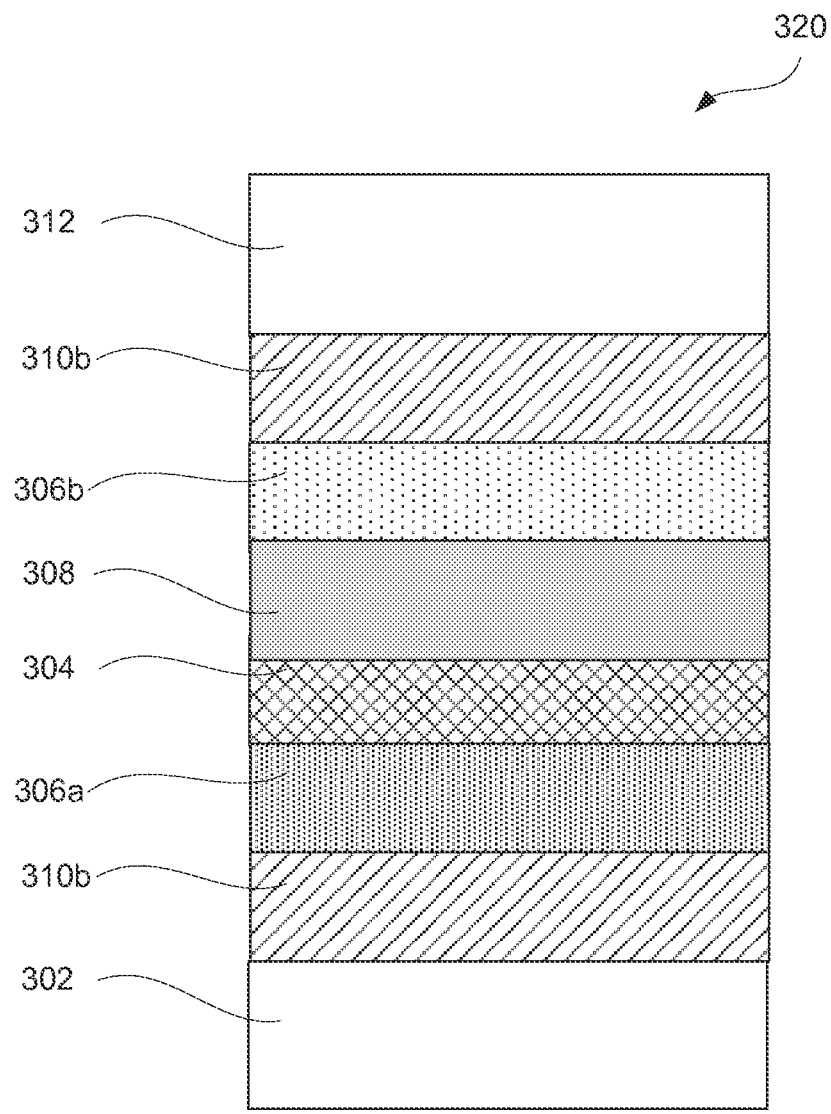
FIG. 3B illustrates a schematic representation of another ReRAM cell including two layers formed from different oxides having different dielectric constants and other layers disposed between these two oxides layers, in accordance with some embodiments.

In some embodiments, a ReRAM cell includes additional components as will now be described with reference to FIG. 3B. FIG. 3B illustrates ReRAM cell 320 that include first signal line 302, current steering element 304, embedded resistor 308, second signal line 312 in addition to first layer 310a, second layer 306a, third layer 306b, and fourth layer 310b described above.

In some embodiments, the electrodes may be sufficiently conductive and may be used as signal lines. Alternatively, signal lines and electrodes may be separate components as, for example, illustrated in FIG. 3B. First signal line 302 and second signal line 312 provide electrical connections to ReRAM cell 300. For example, first signal line 302 and/or second signal line 312 extend between multiple ReRAM cells, which may be cells provided in the same row or the same column of a memory array as further described below with reference to FIGS. 5A and 5B. First signal line 302 and second signal line 312 may be made from conductive materials, such as n-doped polysilicon, p-doped polysilicon, titanium nitride, ruthenium, iridium, platinum, and tantalum nitride. The signal lines may have a thickness of less than about 100 nanometers (nm), such as less than about 50 nm and even less than about 10 nm. Thinner electrodes may be formed using atomic layer deposition (ALD) techniques.

Current steering element 304, if one is present, may be an intervening electrical component, such as a p-n junction diode, p-i-n diode, transistor, or other similar device disposed between first signal line 302 and second signal line 312. As such, current steering element 304 is connected in series with two layers 306a and 306b operable as resistive switching layer. In some embodiments, current steering element 304 may include two or more layers of semiconductor materials, such as two or more doped silicon layers, that are configured to direct the flow of current through the device. Current steering element 304 may be a diode that includes a p-doped silicon layer, an un-doped intrinsic layer, and an n-doped silicon layer. These layers are not specifically identified in FIG. 3B. The overall resistance of current steering element 304 may be between about 1 kilo-Ohm and about 100 Mega-Ohm. The overall resistance generally depends on the type of current steering element 304 and direction of the current flow through current steering element 304 (e.g., forward or reversed biased). In some embodiments, current steering element 304 may include one or more nitrides. For example, current steering element 304 may be a layer of titanium nitride. Embedded resistor 308 may be fabricated from any of metal oxides, metal oxynitrides, metal silicon nitrides, metal silicon oxynitrides, metal aluminum nitrides, metal aluminum oxynitrides, metal boron nitrides, or metal boron oxynitrides.

Forming and Switching Examples

Figure 4:
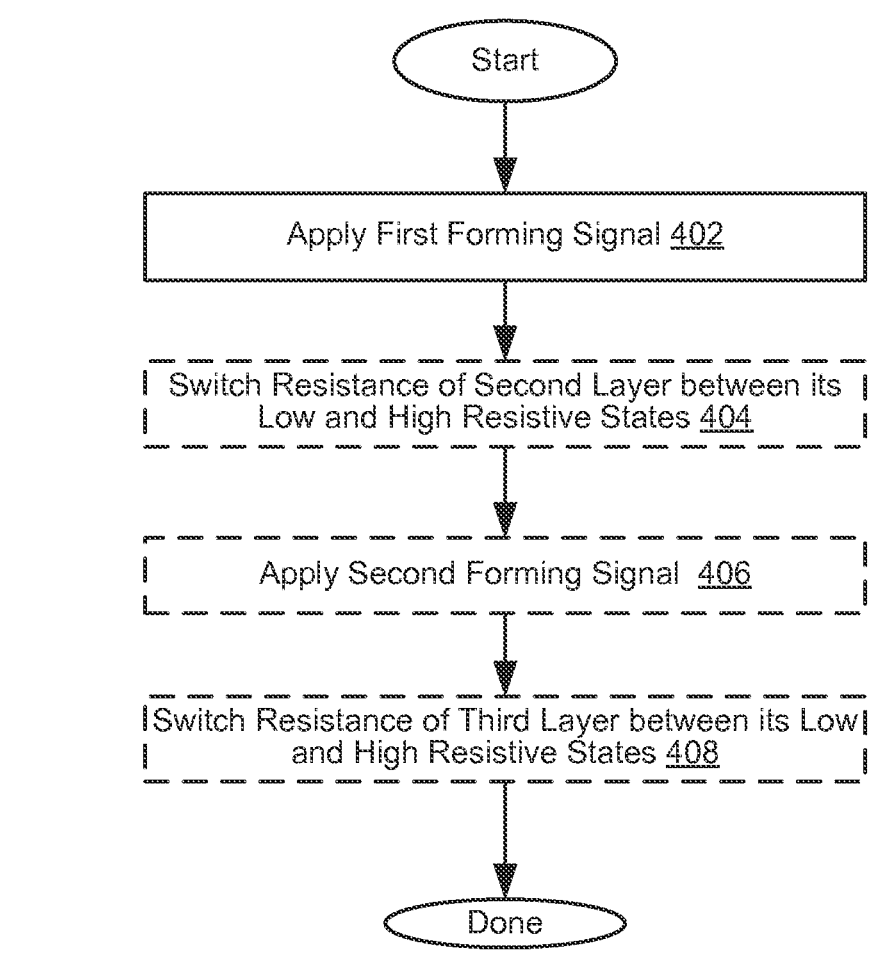
FIG. 4 illustrates a process flowchart corresponding to a method of manipulating a ReRAM cell having multiple different switching levels achieved by combining different oxides having different dielectric constants in the ReRAM cell, in accordance with some embodiments.

FIG. 4 is a process flowchart corresponding to method 400 of manipulating a ReRAM cell, in accordance with some embodiments. Various examples of ReRAM cells are described above with reference to FIGS. 3A and 3B. Method 400 may involve applying a first forming signal between first layer 310a and fourth layer 310b during step 402. During this step, the resistance of second layer 306a changes to a first low resistance, while the resistance of third layer 306b may remain substantially the same. Applying the first forming signal may involve applying a higher potential to first layer 310a than to fourth layer 310b. This polarity may depend on diffusivity of materials in first layer 310a and fourth layer 310b and relative dielectric constants of second layer 306a and third layer 306b as described above. For example, the first forming signal may initiate soft forming and may create one or more conductive paths in second layer 306a, which corresponds to the point 3 in FIG. 2D. For example, a cell having a stack of a 30 Angstrom thick hafnium oxide layer and a 10 Angstrom thick silicon oxide layer may be subjected to a voltage of about 4V and current 10-6 A during this operation. The cell may have a titanium nitride electrode interfacing the hafnium oxide layer and a tantalum nitride electrode interfacing the silicon oxide layer.

Method 400 may also involve switching the resistance of second layer 306a between its first low resistance state and first high resistance state during optional step 404. This step may be referred to as switching with a particular switching level to distinguish it from forming during step 402, for example. In general, switching requires a lot less power than forming because the existing conductive paths are only partially broken and reformed during the switching. Some aspects of this step are described above with reference to FIGS. 1B and 1C as well as FIGS. 2A and 2B. The resistance of second layer 306a in the first low resistance state may be less than its resistance of that layer in the first high resistance state. For example, as first forming continues, forming of the conductive path in second layer 306a may induce the resistance drop of the cell as shown by the transition from point 3 to point 4 in FIG. 2D. It should be noted that switching during step 402 may require different power (e.g., lower power) than switching during step 408.

Method 400 may involve applying a second forming signal between first layer 310a and fourth layer 310b during optional step 406. Applying the second forming signal changes the resistance of third layer 310b to a second low resistance. Step 406 may involve applying a higher potential to first layer 310a than to fourth layer 310b. Again, this polarity may depend on the may depend on diffusivity of materials in first layer 310a and fourth layer 310b and relative dielectric constants of second layer 306a and third layer 306b as described above. Furthermore, the polarity during second forming step 406 may be the same as the polarity during first forming step 402. The resistance of second layer 306a may change during step 406 to a third low resistance such that the third low resistance is less than the first low resistance of second layer 306a. For example, the second forming signal may initiate a forming and a conductive path in third layer 306b, which in turn induces resistance drop of that layer as shown by transition from point 4 to point 5 in FIG. 2D.

Method 400 may also involve switching the resistance of third layer 306b between its second low resistance state and second high resistance state during optional step 408. The resistance of third layer 306b in the second low resistance state is less than the resistance of that layer in its second high resistance state. Switching the resistance of the third layer corresponds to switching the resistance of the second layer. Specifically, when second layer 306a switches from its second low resistive state to its second high resistive state, third layer 306b switches from its third low resistive states to its third high resistive states. Likewise, when second layer 306a switches from its second high resistive state to its second low resistive state, third layer 306b switches from its third high resistive states to its third low resistive states. In the other words, the first switching resistance of the second layer 306a paves the way to the second switching resistance of the third layer 306b, as shown by two step interfaces from point 3 to point 4 and from point 4 to point 5 in FIG. 2D.

Memory Array Examples

Figure 5A:
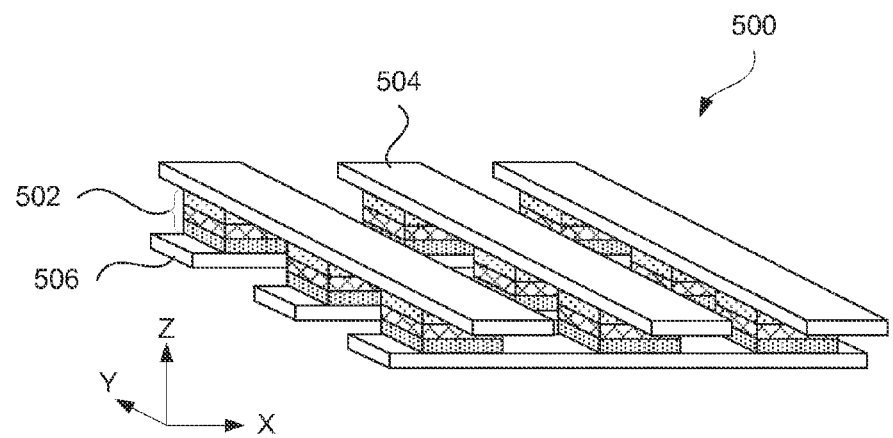
FIGS. 5A and 5B illustrate schematic views of memory arrays including multiple ReRAM cells, in accordance with some embodiments.

A brief description of memory arrays will now be described with reference to FIGS. 5A and 5B to provide better understanding to various aspects of thermally isolating structures provided adjacent to ReRAM cells and, in some examples, surrounding the ReRAM cells. ReRAM cells described above may be used in memory devices or larger integrated circuits (IC) that may take a form of arrays. FIG. 5A illustrates a memory array 500 including nine ReRAM cells 502, in accordance with some embodiments. In general, any number of ReRAM cells may be arranged into one array. Connections to each ReRAM cell 502 are provided by signal lines 504 and 506, which may be arranged orthogonally to each other. ReRAM cells 502 are positioned at crossings of signal lines 504 and 506 that typically define boundaries of each ReRAM cell in array 500.

Signal lines 504 and 506 are sometimes referred to as word lines and bit lines. These lines are used to read and write data into each ReRAM cell 502 of array 500 by individually connecting ReRAM cells to read and write controllers. Individual ReRAM cells 502 or groups of ReRAM cells 502 can be addressed by using appropriate sets of signal lines 504 and 506. Each ReRAM cell 502 typically includes multiple layers, such as first and second electrodes, resistive switching layer, embedded resistors, embedded current steering elements, and the like, some of which are further described elsewhere in this document. In some embodiments, a ReRAM cell includes multiple resistive switching layers provided in between a crossing pair of signal lines 504 and 506.

As stated above, various read and write controllers may be used to control switching of ReRAM cells 502. A suitable controller is connected to ReRAM cells 502 by signal lines 504 and 506 and may be a part of the same memory device and circuitry. In some embodiments, a read and write controller is a separate memory device capable of controlling multiple memory devices each one containing an array of ReRAM cells. Any suitable read and write controller and array layout scheme may be used to construct a memory device from multiple ReRAM cells. In some embodiments, other electrical components may be associated with the overall array 500 or each ReRAM cell 502. For example, to avoid the parasitic-path-problem, i.e., signal bypasses by ReRAM cells in their low resistance state (LRS), serial elements with a particular non-linearity must be added at each node or, more specifically, into each element. Depending on the switching scheme of the ReRAM cell, these elements can be diodes or varistor-type elements with a specific degree of non-linearity. In the same other embodiments, an array is organized as an active matrix, in which a transistor is positioned at each node or, more specifically, embedded into each cell to decouple the cell if it is not addressed. This approach significantly reduces crosstalk in the matrix of the memory device.

Figure 5B:
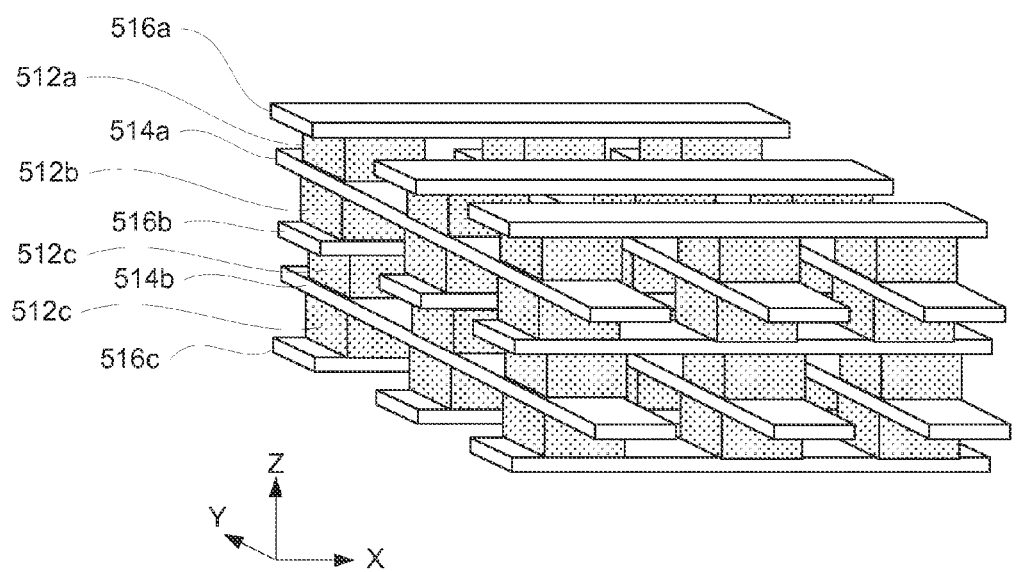

In some embodiments, a memory device may include multiple array layers as, for example, illustrated in FIG. 5B. In this example, five sets of signal lines 514*a-b* and 516*a-c* are shared by four ReRAM arrays 512*a-c*. As with the previous example, each ReRAM array is supported by two sets of signal lines, e.g., array 512*a* is supported by 514*a* and 516*a*. However, middle signal lines 514*a-b* and 516*b*, each is shared by two sets ReRAM arrays. For example, signal line set 514*a* provides connections to arrays 512*a* and 512*b*. First and second sets of signal lines 516*a* and 516*c* are only used for making electrical connections to one array. This 3-D arrangement of the memory device should be distinguished from various 3-D arrangements in each individual ReRAM cell.

CONCLUSION

Although the foregoing examples have been described in some detail for purposes of clarity of understanding, the invention is not limited to the details provided. There are many alternative ways of implementing the invention. The disclosed examples are illustrative and not restrictive.

What is claimed:

1. A memory cell having a multibit architecture, the memory cell comprising:
    a first layer operable as an electrode,
        wherein the first layer comprises one of tungsten nitride or tungsten silicon nitride;
    a second layer comprising a first oxide,
        wherein the second layer directly interfaces the first layer and is operable as a first resistive switching layer configured to switch between a first low resistive state and a first high resistive state;
    a third layer comprising a second oxide,
        wherein a dielectric constant of the second oxide is greater than a dielectric constant of the first oxide;
    a current steering element disposed between the second layer and the third layer, wherein the current steering element is a diode; and
    a fourth layer operable as an electrode;
        wherein the fourth layer comprises a second metal,
        wherein the third layer directly interfaces the fourth layer and is operable as a second resistive switching layer configured to switch between a second low resistive state and a second high resistive state,
        wherein the second layer and the third layer are disposed between the first layer and the fourth layer,
        wherein diffusivity of tungsten into the second layer is less than diffusivity of the second metal into the third layer.

2. The memory cell of claim 1, wherein a combination of the second layer and the third layer is operable to reversibly switch between a low resistive state and a high resistive state in response to applying a switching signal to the memory cell.

3. The memory cell of claim 2, wherein the combination of the second layer and the third layer is operable to form multiple low resistive states in response to applying different forming signals to the memory cell, and wherein the low resistive state is one of the multiple low resistive states.

4. The memory cell of claim 3, wherein applying the different forming signals comprises maintaining a higher potential at the first layer than at the fourth layer.

5. The memory cell of claim 1, wherein the first oxide is silicon oxide, and wherein the second oxide is hafnium oxide.

6. The memory cell of claim 1, wherein the first oxide and the second oxide are sub-stoichiometric oxides.

7. The memory cell of claim 6, wherein the first oxide is SiOx, wherein the second oxide is HfOy, and wherein values of both X and Y are between 1.7 and 1.9.

8. The memory cell of claim 1, wherein the second metal is titanium.

9. The memory cell of claim 1, further comprising a fifth layer operable to maintain a constant resistance when a switching signal is applied to the memory cell to reversibly switch a combination of the second layer and the third layer between a low resistive state and a high resistive state.

10. The memory cell of claim 1, wherein a thickness of the second layer is less than a thickness of the third layer.

11. The memory cell of claim 1, wherein the dielectric constant of the second oxide is at least three times greater than the dielectric constant of the first oxide.

12. The memory cell of claim 1, wherein the second metal is tungsten.

13. The memory cell of claim 1, wherein a thickness of the second layer is between 25% and 50% of a thickness of the third layer.

14. The memory cell of claim 9, wherein the fifth layer is disposed between the second layer and the third layer and comprises a material selected from the group consisting of a metal oxide, a metal oxynitride, a metal silicon nitride, a metal silicon oxynitride, a metal aluminum nitride, a metal aluminum oxynitride, a metal boron nitride, and a metal boron oxynitride.

15. The memory cell of claim 1, wherein the current steering element comprises titanium nitride.

* * * * *